(12) United States Patent
Sato et al.

(10) Patent No.: US 7,745,884 B2
(45) Date of Patent: Jun. 29, 2010

(54) NONVOLATILE SEMICONDUCTOR MEMORY

(75) Inventors: Atsuhiro Sato, Yokohama (JP); Fumitaka Arai, Yokohama (JP); Yasuhiko Matsunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 11/870,114

(22) Filed: Oct. 10, 2007

(65) Prior Publication Data

US 2008/0121965 A1 May 29, 2008

(30) Foreign Application Priority Data

Oct. 13, 2006 (JP) ............... 2006-280536

(51) Int. Cl.
*H01L 27/105* (2006.01)
(52) U.S. Cl. ............ 257/390; 257/202; 257/314; 257/E27.06; 257/E27.081
(58) Field of Classification Search ......... 257/202, 257/390, 314, E27.081, E27.06
See application file for complete search history.

(56) References Cited

U.S. PATENT DOCUMENTS

2005/0083744 A1   4/2005   Arai et al.
2006/0038218 A1*  2/2006   Yaegashi et al. ............ 257/314
2006/0203558 A1*  9/2006   Tanaka et al. ........... 365/185.19
2006/0289938 A1* 12/2006   Kim ........................... 257/365
2008/0212373 A1*  9/2008   Hasegawa et al. ....... 365/185.17

OTHER PUBLICATIONS

U.S. Appl. No. 12/565,181, filed Sep. 23, 2009, Sato, et al.

* cited by examiner

*Primary Examiner*—Victor A Mandala
(74) *Attorney, Agent, or Firm*—Oblon, Spivak, McClelland, Maier & Neustadt, L.L.P.

(57) ABSTRACT

A nonvolatile semiconductor memory of an aspect of the present invention comprises a plurality of memory cell transistors which are connected in series to one another with a first gate spacing, every two adjacent transistors of the memory cell transistors sharing a source/drain diffusion layer, and a first select gate transistor which shares a source/drain diffusion layer with an endmost memory cell transistor that is located at one end of the series connection of the memory cell transistors and is adjacent to that memory cell transistor with a second gate spacing. The second gate spacing is set larger than the first gate spacing and the source/drain diffusion layer shared by the endmost memory cell transistor and the first select gate transistor contains a region which is higher in impurity concentration than the source/drain diffusion layer shared by two adjacent memory cell transistors.

16 Claims, 12 Drawing Sheets

NONVOLATILE SEMICONDUCTOR MEMORY

CROSS-REFERENCE TO RELATED APPLICATIONS

This application is based upon and claims the benefit of priority from prior Japanese Patent Application No. 2006-280536, filed Oct. 13, 2006, the entire contents of which are incorporated herein by reference.

BACKGROUND OF THE INVENTION

1. Field of the Invention

The present invention relates to a nonvolatile semiconductor memory and more particularly to a flash memory.

2. Description of the Related Art

Nonvolatile semiconductor memories (for example, flash memories) have been incorporated into various electronic devices because they allow high packing densities.

Therefore, the demand has increased for further scaling down the dimensions of devices used in and increasing the operational reliability of the flash memories (see, for example, U.S. Pat. App. No. 2005/0083744).

In general, the flash memories are structured such that adjacent transistors share their source/drain regions. That is, the drain of a select gate transistor which is adjacent to the source of a memory cell transistor serves as the source of that cell transistor.

In such a structure, gate-induced drain leakage (GIDL) occurs at the drain of the select gate transistor adjacent to the memory cell transistor at the non-writing time ("1" programming time) of the cell transistor when the select gate transistor is placed in the off state.

After that, a write voltage is applied to a control gate electrode (word line). This write voltage is also applied to memory cell transistors ("1" programming cells) which do not need to be written to because the control gate electrode is common to memory cell transistors which are adjacent to one another in the row direction (x direction).

Even if the memory cell transistor connected to the drain of the select gate transistor is a "1" programming cell, therefore, there is the possibility that hot electrons resulting from the GIDL are drawn by the write voltage without extinction and then injected into the floating gate electrode. As a result, erroneous writing to the memory cell transistor occurs.

Such erroneous writing due to hot electrons has become remarkable as the dimensions of memory cells have been scaled down and hence the gate spacing has become reduced. In flash memories in which one memory cell has two or more thresholds as with multi-level flash memories, this problem will result in failure to perform precise threshold voltage control, lowering the reliability.

BRIEF SUMMARY OF THE INVENTION

According to an aspect of the invention, there is provided a nonvolatile semiconductor memory comprising: a plurality of memory cell transistors which are connected in series to one another with a first gate spacing, every two adjacent transistors of the memory cell transistors sharing a source/drain diffusion layer; and a first select gate transistor which shares a source/drain diffusion layer with an endmost memory cell transistor that is located at one end of the series connection of the memory cell transistors and is adjacent to that memory cell transistor with a second gate spacing, wherein the second gate spacing is set larger than the first gate spacing and the source/drain diffusion layer shared by the endmost memory cell transistor and the first select gate transistor contains a region which is higher in impurity concentration than the source/drain diffusion layer shared by two adjacent memory cell transistors.

According to an aspect of the invention, there is provided a nonvolatile semiconductor memory comprising: a plurality of first memory cell transistors which are connected in series to one another with a first gate spacing between each memory cell transistor and the adjacent one and share a source/drain diffusion layer between every two adjacent memory cell transistors; a second memory cell transistor which shares a source/drain diffusion layer with an endmost memory cell transistor of the series-connected memory cell transistors and is adjacent to the endmost memory cell transistor with a second gate spacing therebetween; and a first select gate transistor which shares a source/drain diffusion layer with the second memory cell transistor and is adjacent to the second memory cell transistor with a third gate spacing therebetween, wherein the first gate spacing is larger than the second gate spacing but smaller than the third gate spacing, and the source/drain diffusion layer shared by the second memory cell transistor and the first select gate transistor contains a region which is higher in impurity concentration than the source/drain diffusion layer shared by the memory cell transistors.

DETAILED DESCRIPTION OF THE INVENTION

The embodiments of the present invention will be described hereinafter in detail with reference to the accompanying drawings.

1. Outline

In embodiments of the invention, the spacing of the gates of a memory cell transistor and a select gate transistor which are adjacent to each other is set larger than that of two adjacent memory cell transistors.

In addition, that source diffusion layer of the memory cell transistor which is shared by the adjacent select gate transistor contains a region which is higher in impurity concentration than the source/drain diffusion layer shared between two adjacent memory cell transistors.

This will increase the possibility that hot electrons resulting from the GIDL of the select gate transistor are scattered or trapped within the diffusion layer shared between the memory cell transistor and the select gate transistor.

It therefore becomes possible to reduce the possibility that the hot electrons are injected into the floating gate electrode of the memory cell transistor.

Accordingly, erroneous writing to memory cell transistors can be reduced.

2. Embodiments (1) First Embodiment (a) Structure

The structure of a nonvolatile semiconductor memory embodying the invention will be described with reference to FIGS. 1 and 2. This embodiment will be described in terms of a flash memory, which is an example of the nonvolatile semiconductor memory.

Figure 1:
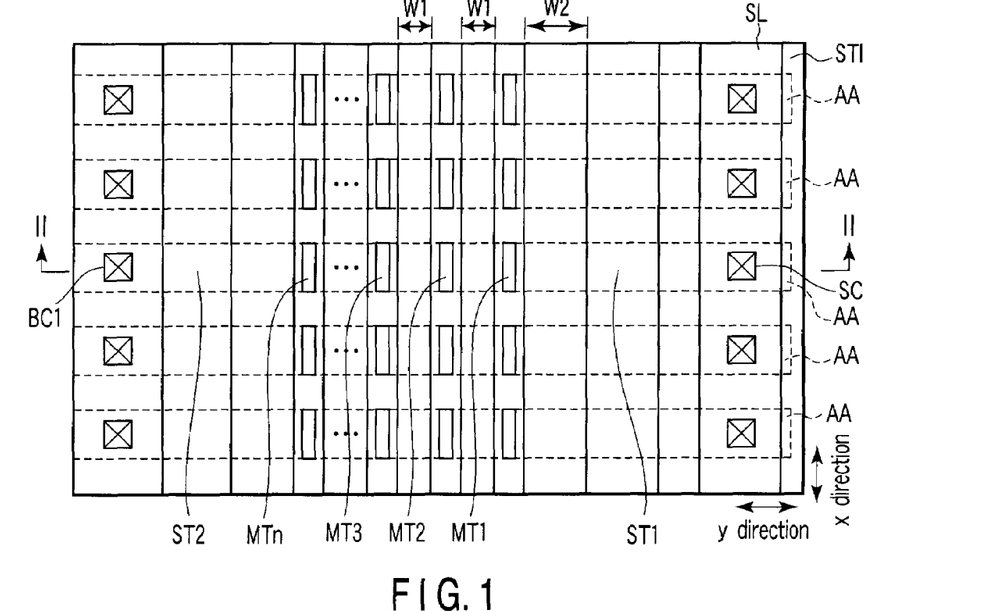
FIG. 1 is a plan view of a flash memory according to a first embodiment.

FIG. 1 is a plan view of the flash memory of the embodiment. FIG. 2 is a sectional view taken along line II-II of FIG. 1 in the y direction. The flash memory illustrated in FIGS. 1 and 2 is a NAND type flash memory.

The surface region of a semiconductor substrate 1 is composed of isolation insulating regions STI of, for example, a shallow trench isolation (STI) structure and active regions (device regions) AA surrounded by the isolation insulating regions. The active regions AA, which are shown enclosed by dashed lines in FIG. 1, extend along the y direction (first direction) in FIG. 1.

A number of memory cell transistors MT1 to MTn (n is a natural number) is arranged in each of the active regions AA.

Each of the memory cell transistors MT1 to MTn has a stacked gate structure comprised of a floating gate electrode 3A and a control gate electrode 5A.

The floating gate electrode 3A is formed on a gate insulating film (tunnel insulating film) 2A formed in the corresponding active area AA. The floating gate electrode 3A is isolated from adjacent ones by the isolation insulating layer (not shown) formed in isolation insulating regions STI.

The control gate electrode 5A is formed over the floating gate electrode 3A with an intergate insulating film 4A interposed therebetween so as to cover the width of the corresponding channel (in the x direction). The control gate electrode 5A extends in the x direction (second direction) perpendicular to the y direction and functions as a word line.

Diffusion layers 6A are each formed as a source/drain diffusion layer to connect two adjacent memory transistors in series.

First and second select gate transistors ST1 and ST2 are placed at both ends of a NAND string composed of the memory cell transistors MT1 to MTn.

The gate electrodes of the select gate transistors ST1 and ST2 are each formed at the same time the gate electrodes of the memory cell transistors are formed and therefore structured to have stacked gates. Consequently, intergate insulating films 4B and 4C of the select gate transistors ST1, ST2 are formed with openings so as to connect the gate electrodes 3B and 3C formed on gate insulating films 2B and 2C to gate electrodes 5B and 5C, respectively.

The memory cell transistor MT1 and the select gate transistor ST1, which are adjacent to each other, share source/drain diffusion regions 6A and 6B, so that they are connected in series. Likewise, the memory cell transistor MTn and the select gate transistor ST2, which are adjacent to each other, share source/drain diffusion regions 6A and 6B, so that they are connected in series.

That is, the source diffusion layers 6A and 6B of the memory cell transistor MT1 serve also as the drain of the first select gate transistor ST1 and are shared by these transistors.

The source diffusion layers 6A and 6B of the select gate transistor ST1 are connected to a source line SL via a source line contact SC. The source diffusion layer 6B is formed to have an impurity concentration which is, for example, two orders of magnitude higher than for the diffusion layer 6A in order to form ohmic contact between the source line contact SC and it. In this embodiment, therefore, the impurity concentration of the diffusion layer 6B shared by the memory cell transistor MT1 and the select gate transistor ST1 is also, for example, two orders of magnitude higher than for the diffusion layer 6A.

The drain diffusion layers 6A and 6B of the memory cell transistor MTn serve also as the source of the select gate transistor ST2 and are shared by these transistors.

The drain diffusion layers 6A and 6B of the second select gate transistors ST2 are connected to a bit line BL through bit line contacts BC1 and BC2 and a metal interconnection layer M1.

Each of the gate electrodes of the memory cell transistors MT1 to MTn and the select gate transistors ST1 and ST2 is formed on sidewall with a spacer film 7.

The memory cell transistors MT1 to MTn and the select gate transistors ST1 and ST2 thus structured are connected in series with one another with the following gate spacings.

The two adjacent memory cell transistors are formed to have a gate spacing of W1 therebetween. The gate spacing W1 is set such that the space between the gate electrodes is completely filled with the sidewall spacers 7 formed on the gate electrodes of the adjacent memory cell transistors.

The memory cell transistor MT1 and the select gate transistor ST1 are formed to be connected in series with a gate spacing of W2 therebetween. The gate spacing W2 differs from W1 and is set such that the space between their gate electrodes is not completely filled with the sidewall spacers 7 formed on the gate electrodes. That is, W2 is set larger than W1.

In the embodiment, the memory cell transistor MTn and the select gate transistor ST2 are formed to be connected in series with a gate spacing of W2 therebetween.

The above structure causes hot electrons resulting from the GIDL that occurs at the drain of the select gate transistor ST1 to move within the highly-doped diffusion layer 6B. As a result, the hot electrons are scattered or trapped by impurities within the diffusion layer 6B.

The hot electrons will travel through a distance of W2, the gate spacing of the transistors ST1 and MT1. The fact that the hot electrons travel through a long distance (W2) will increase the possibility that they are scattered or trapped by impurities within the diffusion layer 6B.

This will reduce the possibility that the hot electrons resulting from the GIDL associated with the select gate transistor ST1 are injected into the floating gate electrode 3A of the memory cell transistor MT1.

Accordingly, the above structure allows erroneous writing to memory cell transistors to be reduced.

Hereinafter, a description is given of a method of manufacturing the flash memory structured as described above.

(b) Manufacturing Method

Figure 2:
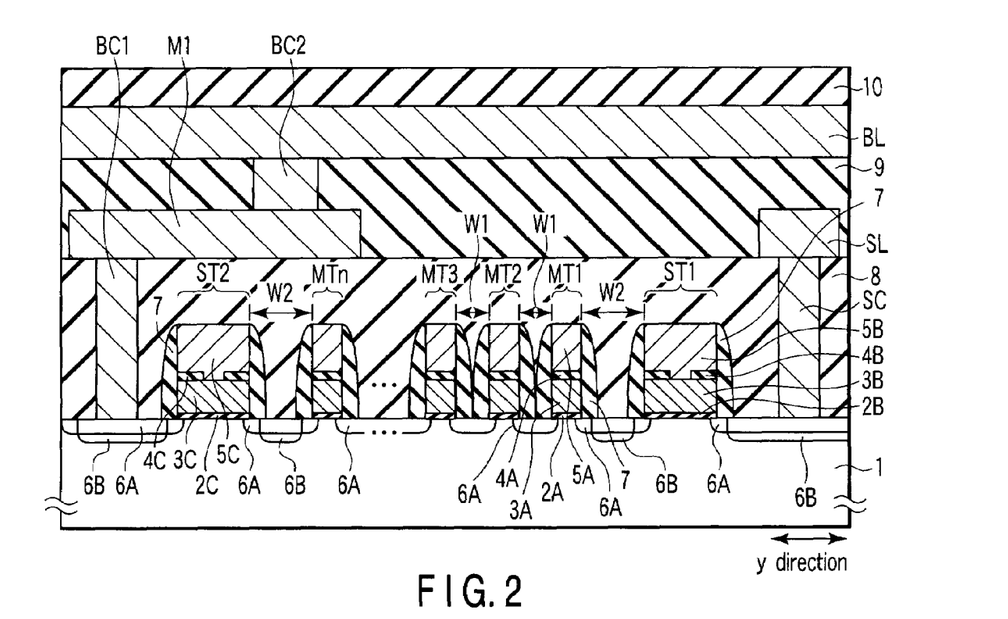
FIG. 2 is a sectional view taken along line II-II of FIG. 1.

Reference is now made to FIGS. 3 to 10 to describe the method of manufacturing the flash memory shown in FIG. 2.

Figure 3:
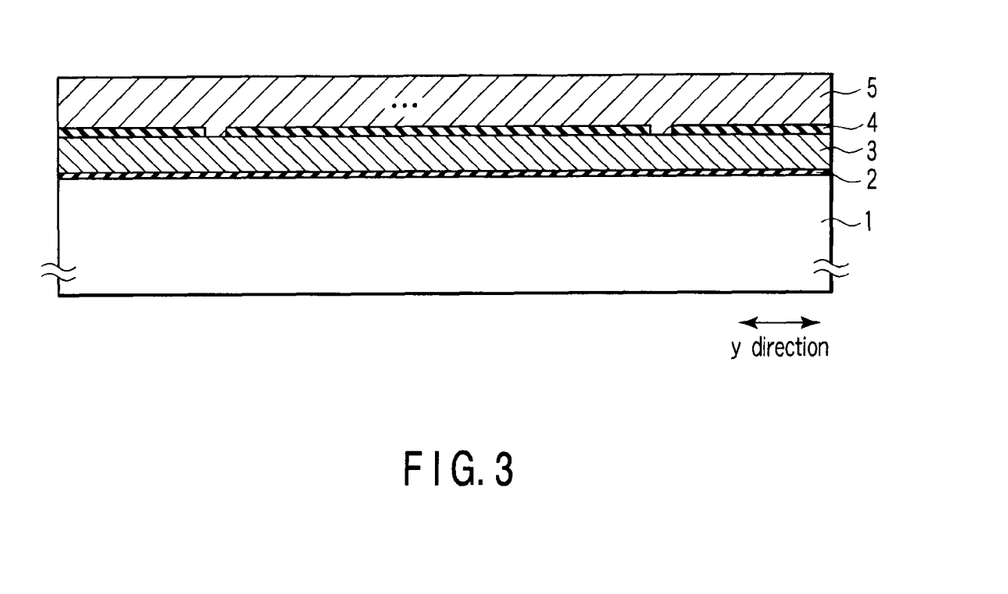
FIG. 3 is sectional views, in the order of steps of manufacture, of the flash memory of the first embodiment.

As shown in FIG. 3, a semiconductor substrate 1 is formed on top with a gate insulating film 2 by the thermal oxidation by way of example. Then, a polysilicon film 3 which is to be formed into floating gate electrodes is formed on the gate insulating film 2 by chemical vapor deposition (CVD).

Isolation trenches (not shown) of STI structure are formed into the semiconductor substrate 1 using photolithographic and reactive ion etching (RIE) techniques. After that, the isolation trenches are filled with a isolation insulating film (not shown) so that its top is at the same level as the surface of the polysilicon film 3. Thereby, active regions where memory cells are to be formed and isolation regions are formed.

An ONO film 4 which is to be formed into intergate insulating film is formed over the entire surface of the active regions and the isolation regions by CVD. Then, the ONO film 4 is coated on top with a layer of resist (not shown) and then formed with openings in regions where select gate transistors are to be formed by using photolithographic and RIE techniques. The intergate insulating film is not limited to the ONO film and may be made of silicon oxide, silicon nitride, or silicon oxy-nitride. In addition, the intergate insulating film may be a single-layer or multi-layer film which contains at least one selected from high-permittivity materials, such as alumina, hafnium oxide, tantalum oxide, lanthanum oxide, etc. The use of a high-permittivity material for the intergate insulating film allows the coupling ratio of the memory cell transistors to be improved.

After removal of the resist on the ONO film 4, a polysilicon film 5 which is to be formed into control gate electrodes is formed by CVD so as to cover the entire surface of the ONO film.

After a resist (not shown) has been coated onto the polysilicon film 5, the polysilicon film 5, the ONO film 4, the polysilicon film 3 and the gate insulating film 2 are etched in sequence by using photolithographic and RIE techniques and then the resist on the polysilicon film 5 is removed.

Figure 4:
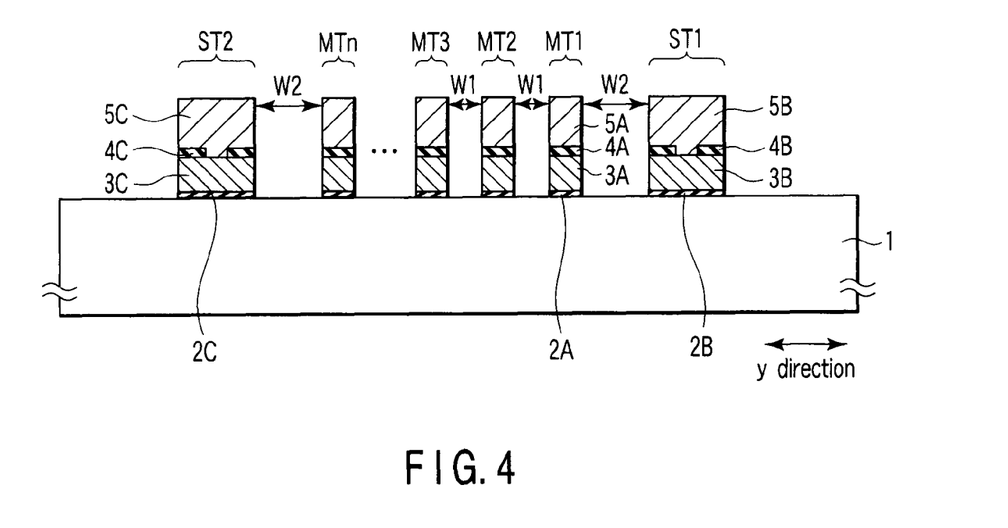
FIG. 4 is sectional views, in the order of steps of manufacture, of the flash memory of the first embodiment.

As shown in FIG. 4, the gate electrodes of the select gate transistors ST1 and ST2 and the memory cell transistors MT1 to MTn are formed.

In this etching process, the resist is patterned so that the gate spacing of two adjacent memory cell transistors is W1 and the gate spacing of the select gate transistor ST1 and the memory cell transistor MT1 is W2 and etching is then carried out using this resist pattern as a mask.

The gate spacing W1 is selected such that the space between the gates of two adjacent memory cell transistors is filled up by sidewall spacers to be formed in a subsequent step on their gate electrodes. The gate spacing W2 is larger than W1 and selected such that the space between the gate of the select gate transistor ST1 and the memory cell transistor MT1 is not filled up by sidewall spacers to be formed at a later time on their gate electrodes. In this embodiment, the gate spacing of the select gate transistor ST2 and the memory cell transistor MTn is also set to W2.

Figure 5:
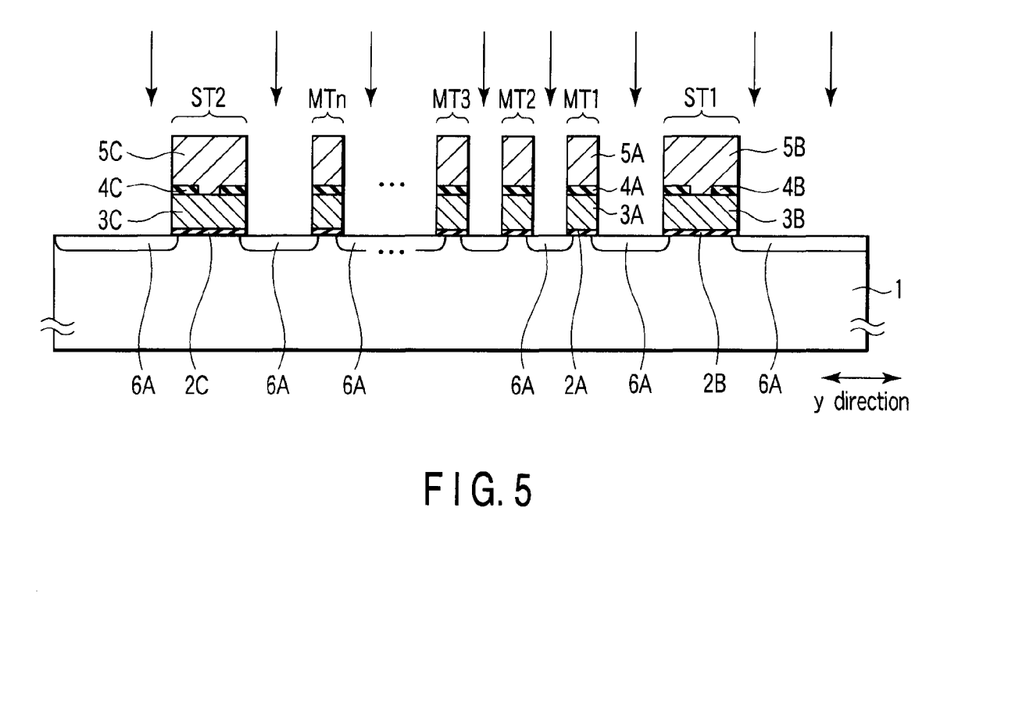
FIG. 5 is sectional views, in the order of steps of manufacture, of the flash memory of the first embodiment.

As shown in FIG. 5, the diffusion layers 6A are formed in a self-aligned manner by means of ion implantation using the gate electrodes of the memory cell transistors MT1 to MTn and the select gate transistors ST1 and ST2 as a mask.

Figure 6:
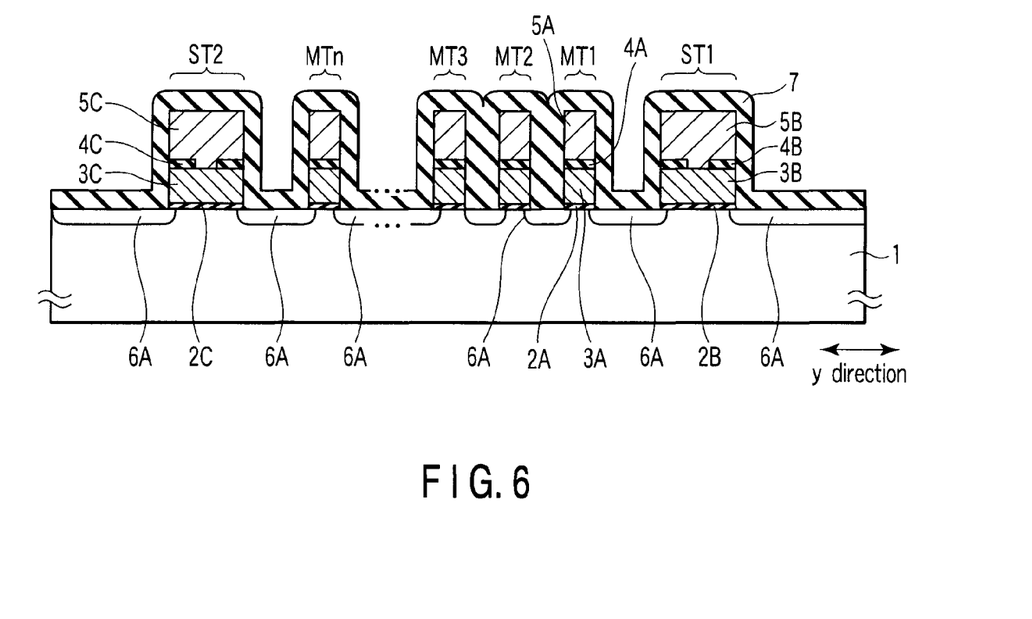
FIG. 6 is sectional views, in the order of steps of manufacture, of the flash memory of the first embodiment.

As shown in FIG. 6, a film 7 of silicon oxide which is to be formed into the gate sidewall spacers is deposited onto the entire surface of the semiconductor substrate by using CVD. At this point, the silicon oxide film 7 is formed at such a thickness that the space between the gate electrodes of the select gate transistor ST1 and the memory cell transistor MT1 is not filled up by the gate sidewall spacers but the space between the gates of adjacent memory cell transistors is filled up.

Figure 7:
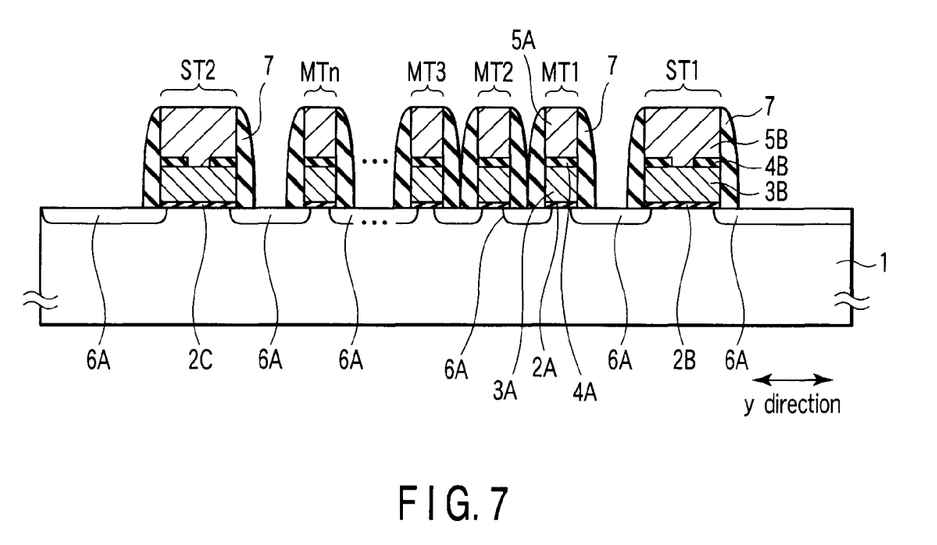
FIG. 7 is sectional views, in the order of steps of manufacture, of the flash memory of the first embodiment.

The silicon oxide film 7 is etched back by means of RIE so that the sidewall spacers of the silicon oxide film are left only on the sidewalls of the gate electrodes of the memory cell transistors MT1 to MTn and the select gate transistors ST1 and ST2 as shown in FIG. 7.

The space between the gates of two adjacent memory cell transistors is filled up by the sidewall spacers 7. On the other hand, the space between the gate electrodes of the select gate transistor ST1 and the memory cell transistor MT1 is not filled up by the sidewall spacers 7 on their respective gate electrodes, resulting in the surface of the diffusion layer 6A therebetween being exposed as shown in FIG. 7.

Figure 8:
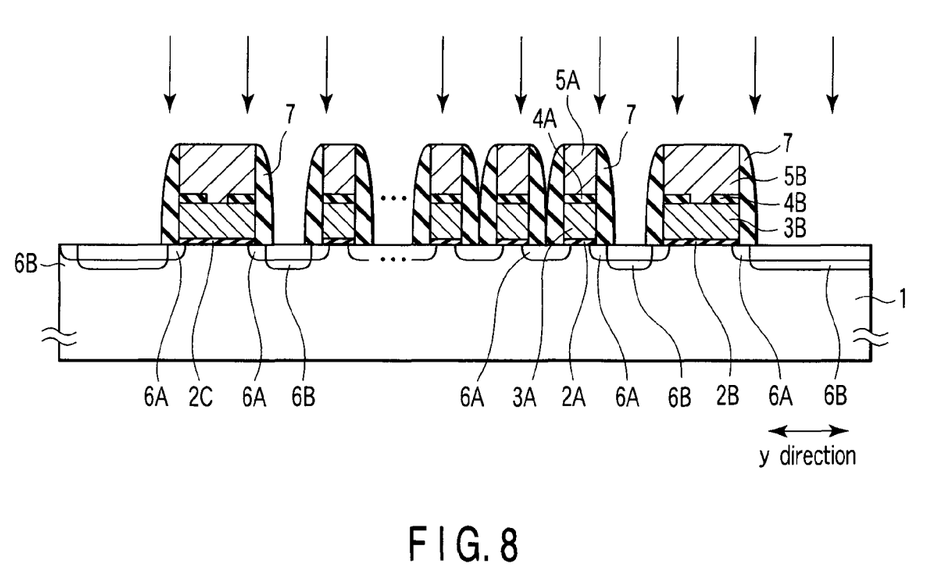
FIG. 8 is sectional views, in the order of steps of manufacture, of the flash memory of the first embodiment.

As shown in FIG. 8, the diffusion layers 6B are formed in a self-aligned manner by means of ion implantation using the sidewall spacers 7 as a mask. Here, since the space between every two adjacent memory cell transistors is filled up by the sidewall spacers, the diffusion layer 6A therebetween is not exposed. Therefore, a new resist mask used for forming the diffusion layers 6B need not to be formed so as to cover the surface of the diffusion layer 6A shared by two adjacent memory cell transistor.

The diffusion layers 6B are formed with an impurity concentration which is, for example, two orders of magnitude higher than for the diffusion layer 6A in order to provide ohmic contact with the source line contact to be formed in a subsequent step.

Figure 9:
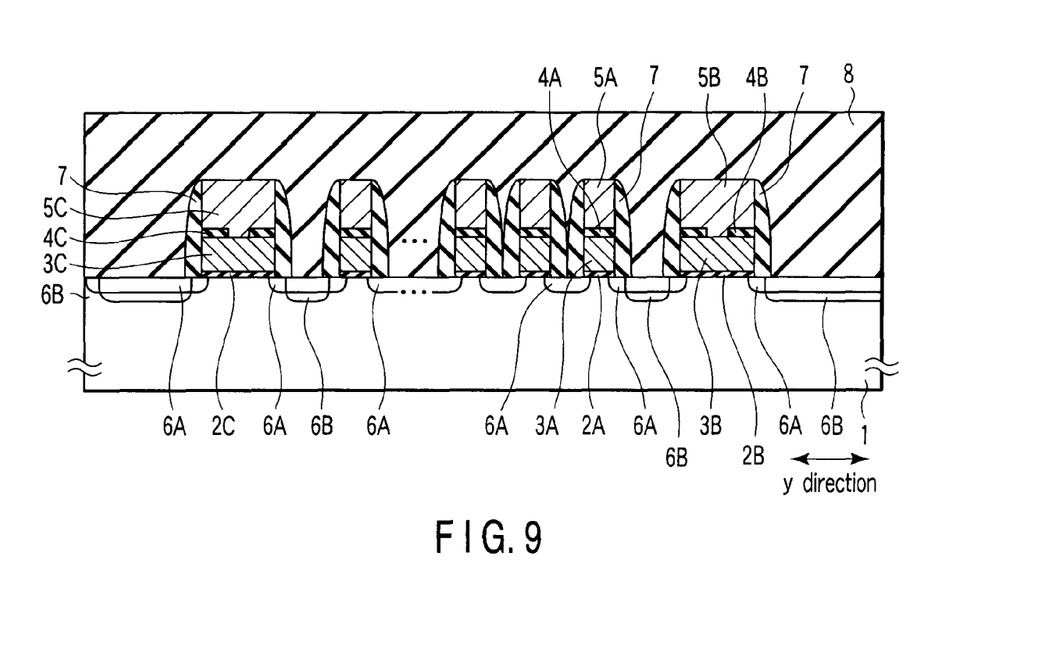
FIG. 9 is sectional views, in the order of steps of manufacture, of the flash memory of the first embodiment.

A film of silicon oxide is formed by means of CVD and the top surface of that silicon oxide film is then planarized by chemical mechanical polishing (CVD). As a result, an insulating layer 8 is formed as shown in FIG. 9.

Figure 10:
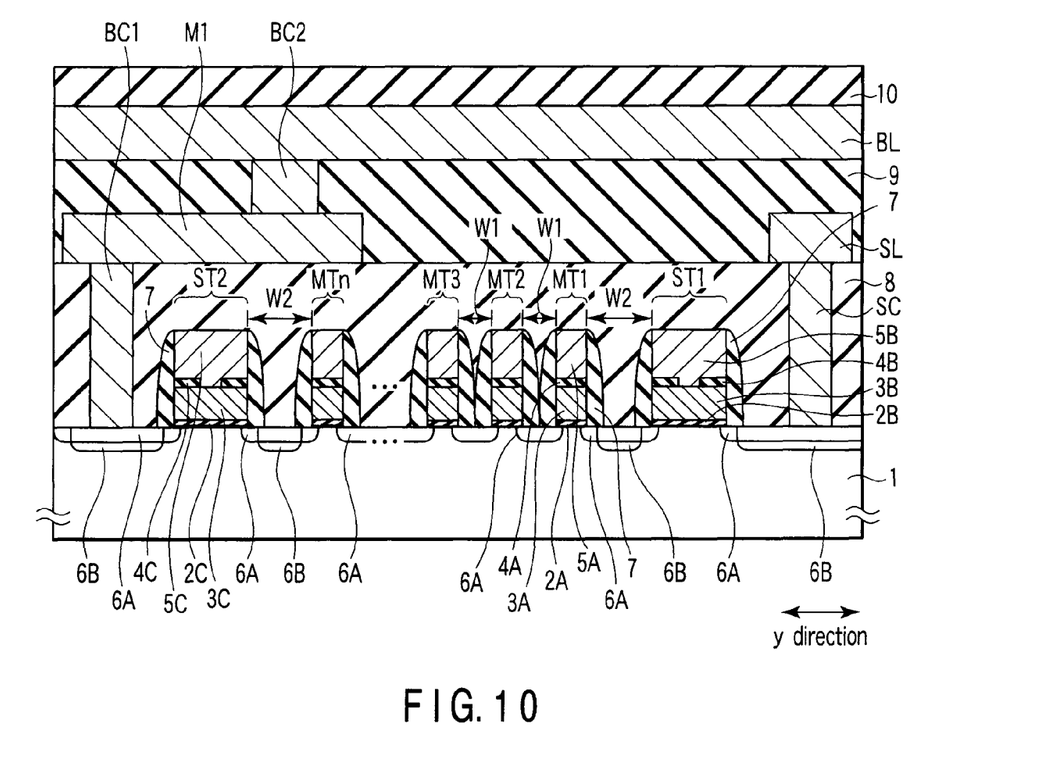
FIG. 10 is sectional views, in the order of steps of manufacture, of the flash memory of the first embodiment.

As shown in FIG. 10, the source line contact SC is buried through a contact hole formed in the insulating layer 8 so as to reach the diffusion layers 6A and 6B of the select gate transistors ST1. Also, the first bit line contact BC1 is buried through a contact hole formed in the insulating layer 8 so as to reach the diffusion layers 6A and 6B of the select gate transistors ST2.

The source line SL is connected to the source diffusion layers 6A and 6B of the select gate transistor ST1 through the source line contact SC. In addition, the metal interconnection layer M1 is connected to the drain diffusion layers 6A and 6B of the select gate transistor ST2 through the bit line contact BC1.

After an insulating layer 9 has been formed over the entire surface, a second bit line contact BC2 is connected to the metal interconnection layer M1 through a contact hole formed in the insulating layer 9.

A bit line BL is connected to the drain diffusion layers 6A and 6B of the select gate transistor ST2 through the bit line contacts BC1 and BC2 and the metal interconnection layer M1.

An insulating layer 10 is formed over the entire surface of the semiconductor substrate 1, thereby finishing the flash memory of the embodiment.

With the flash memory fabricated in accordance with the above steps, the gate spacing, W2, of the select gate transistor ST1 and the memory cell transistor MT1 is set larger than the gate spacing, W1, of two adjacent memory cell transistors.

In addition, the impurity concentration of the diffusion layers 6A and 6B shared by the select gate transistor ST1 and the memory cell transistor MT1 is higher than for the diffusion layer 6A shared by two adjacent memory cell transistors because of the highly-doped diffusion layer 6B.

Therefore, hot electrons resulting from the GIDL of the select gate transistor ST1 come to move through the highly-doped diffusion layers 6A and 6B between the memory cell transistor MT1 and the select gate transistor ST1, which increases the possibility that they are scattered or trapped by impurities within the diffusion layers 6A and 6B.

This reduces the possibility that GIDL-based hot electrons are injected into the floating gate electrode 3A of the memory cell transistor MT1.

It therefore becomes possible to reduce erroneous writing to memory cell transistors.

3. Modifications (1) First Modification (a) Structure

Figure 11:
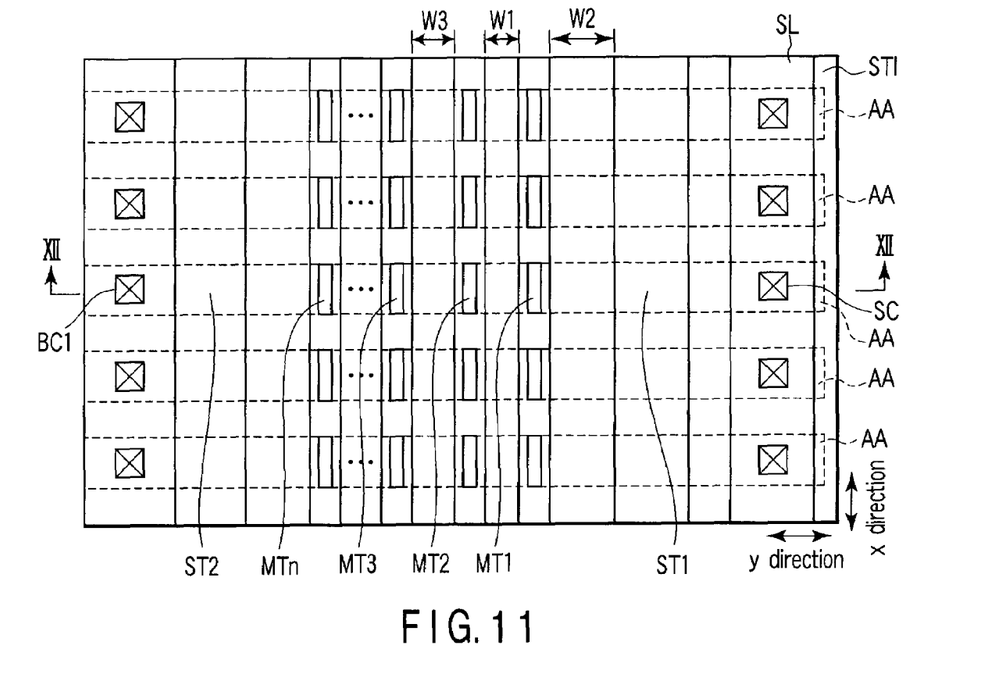
FIG. 11 is a plan view illustrating the structure of a flash memory of a first modification.
Figure 12:
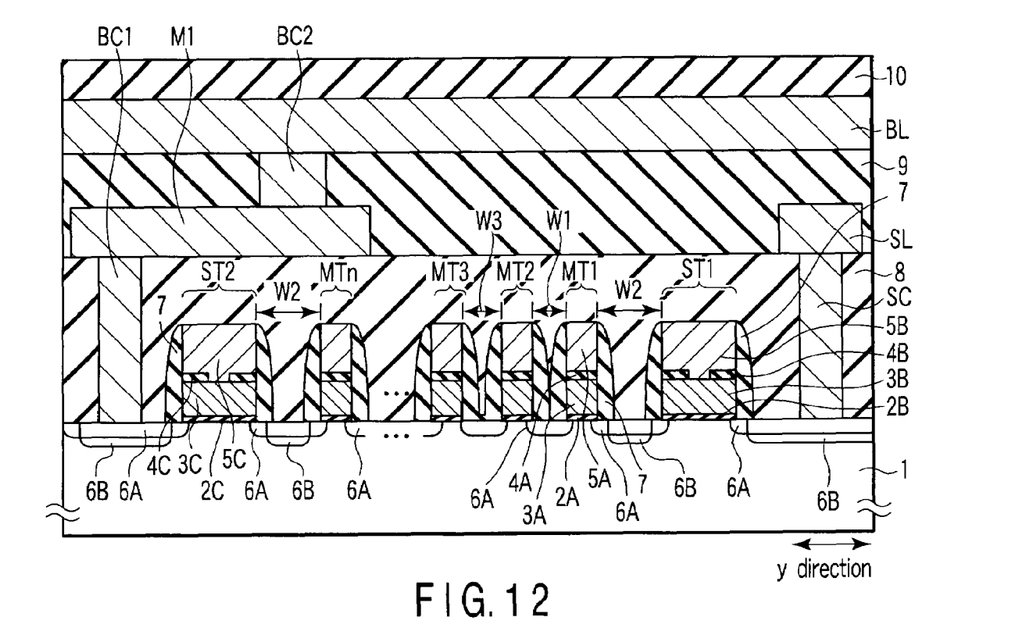
FIG. 12 is a sectional view taken along line XII-XII of FIG. 11.

Reference is made to FIGS. 11 and 12 to describe the structure of a flash memory according to this modification. FIG. 11 is a plan view of this flash memory. FIG. 12 is a sectional view taken along line II-II of FIG. 11 in the y direction. In FIGS. 11 and 12, like reference numbers are used to denote corresponding parts to those in FIGS. 1 and 2, thereby simplifying the description.

In this modification, the gate spacing W3 of two adjacent transistors of the memory cell transistors MT2 to MTn-1 is set such that W1<W3<W2. That is, the memory cell transistors MT1 and MTn are displaced to the sides of the memory cell transistors MT2 and MTn-1, respectively, to thereby increase the spacings between the transistors ST1 and MT1 and between the transistors ST2 and MTn. Thus, the relation such that W1<W3<W2 holds.

In addition, if the spacings between the transistors ST1 and MT1 and between the transistors ST2 and MTn prior to displacement of the transistors MT1 and MTn are W3, the relation such that W1+W2=2×W3 holds.

The space between two adjacent transistors of the memory cell transistors MT2 to MTn-1 the gate spacing of which is W3 is filled up by sidewall spacers formed on their respective gates.

This modification can provide the same advantages as the first embodiment described above without increasing the area of the region where the memory cell transistors are placed.

(b) Manufacturing Method

The method of manufacturing the flash memory of this modification will be described with reference to FIG. 13.

Figure 13:
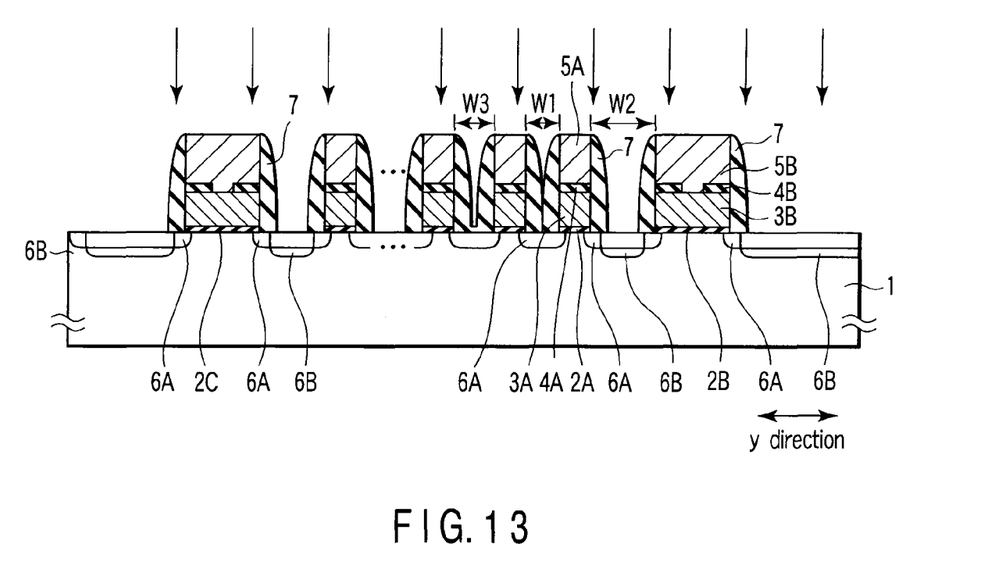
FIG. 13 is a sectional view illustrating a step of manufacturing the flash memory of the first modification.

The manufacturing method of this modification is substantially the same as the manufacturing method of the first embodiment illustrated in FIGS. 3 to 10 but differs in that, as shown in FIG. 13, the spacing of two adjacent transistors of the memory cell transistors MT2 to MTn-1 is set to W3 in forming the gate electrodes of the select gate transistors ST1 and ST2 and the memory cell transistors MT1 to MTn.

In FIG. 13, the space between every two adjacent transistors of the memory cell transistors MT1 to MTn is filled up by the sidewall spacers 7; therefore, the diffusion layers 6A which have been formed through the spaces are not exposed. Therefore, a new resist mask used in forming the diffusion layers 6B need not be formed so as to cover the surface of the diffusion layer 6A shared by two adjacent memory cell transistor.

(2) Second Modification (a) Structure

The structure of a flash memory according to this modification will be described with reference to FIG. 14, in which like reference numbers are used to denote corresponding parts to those in FIG. 2, thereby simplifying the description.

This modification has the features of the first embodiment and is additionally characterized in that a recess X1 is formed in the source diffusion layers 6A and 6B of the memory cell transistor MT1 which are shared with the select gate transistor ST1. In this case, recesses X2 are also formed in the source diffusion layers 6A and 6B of the select gate transistor ST1 and the source and drain diffusion layers 6A and 6B of the select gate transistor ST2.

Thereby, GIDL-based hot electrons make a detour to avoid the recess X1 and move in the diffusion layers 6A and 6B toward the memory cell transistor MT1.

Therefore, the distance moved by the hot electrons becomes longer than W2, further increasing the possibility that the hot electrons are scattered or trapped by impurities within the diffusion layers 6A and 6B.

This further reduces the possibility that the hot electrons resulting from the GIDL of the select gate transistor ST1 are injected into the floating gate electrode 3A of the memory cell transistor MT1.

It therefore becomes possible to reduce erroneous writing to memory cell transistors.

The method of manufacturing the flash memory of the structure described above will be described hereinafter.

(b) Manufacturing Method

Figure 14:
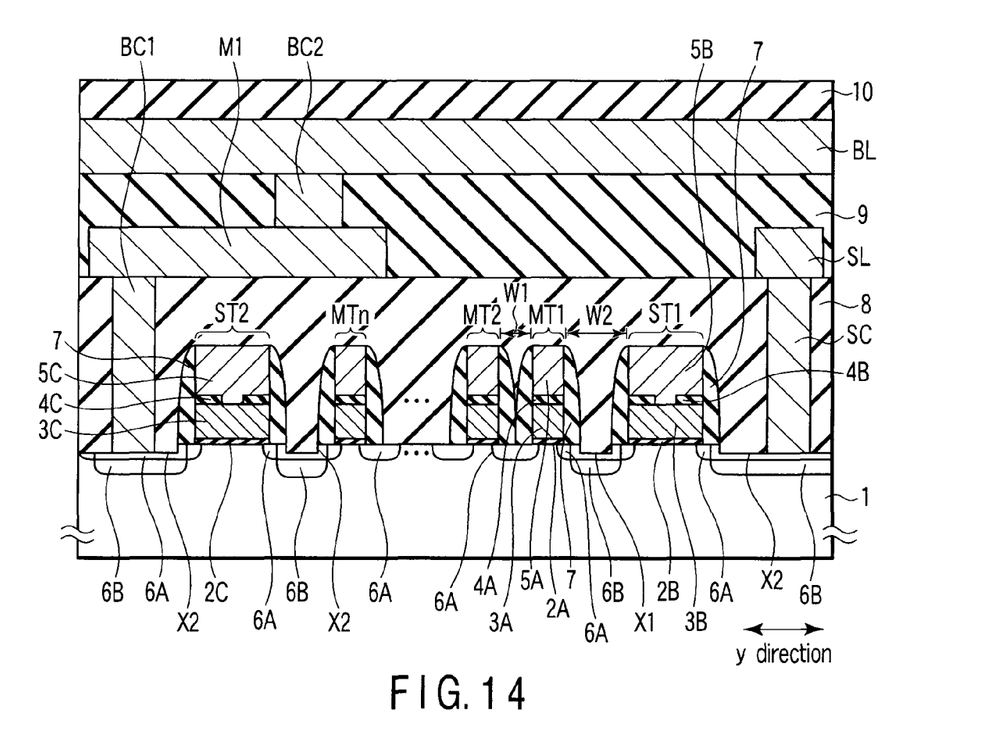
FIG. 14 is a sectional view of a flash memory according to a second modification.
Figure 15:
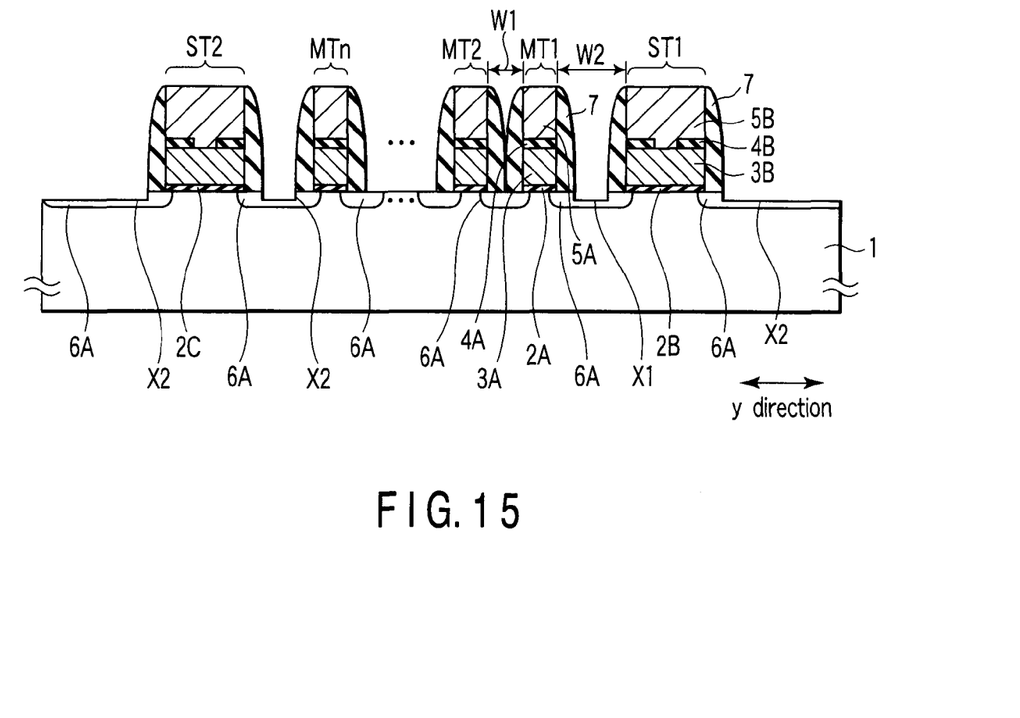
FIGS. 15, 16 and 17 are sectional views, in the order of steps of manufacture, of the flash memory of the second modification.
Figure 16:
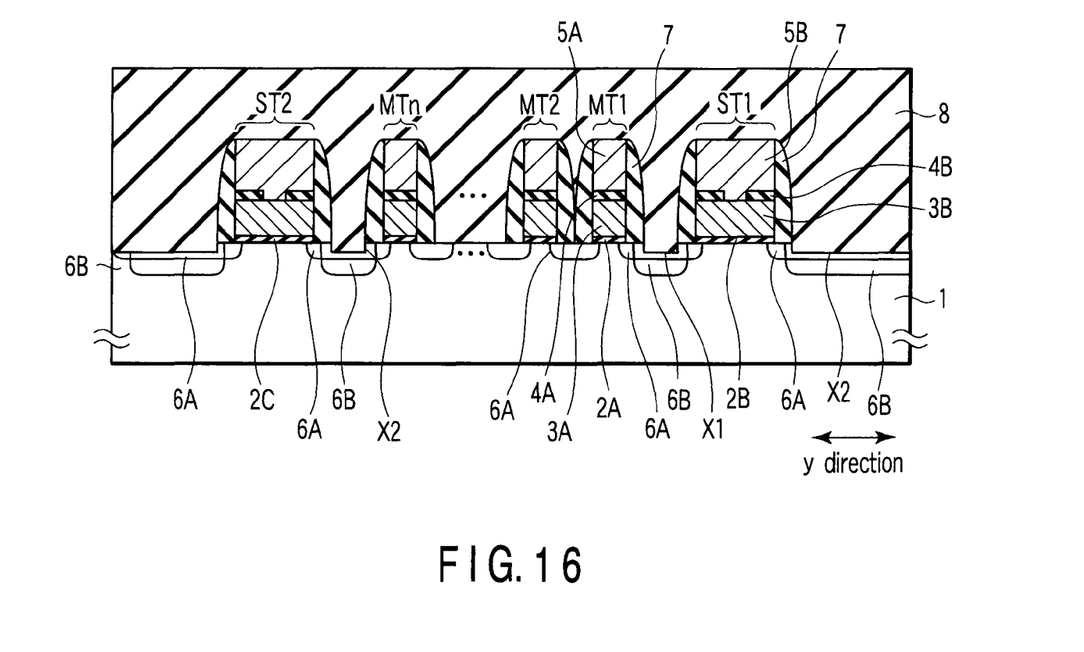
Figure 17:
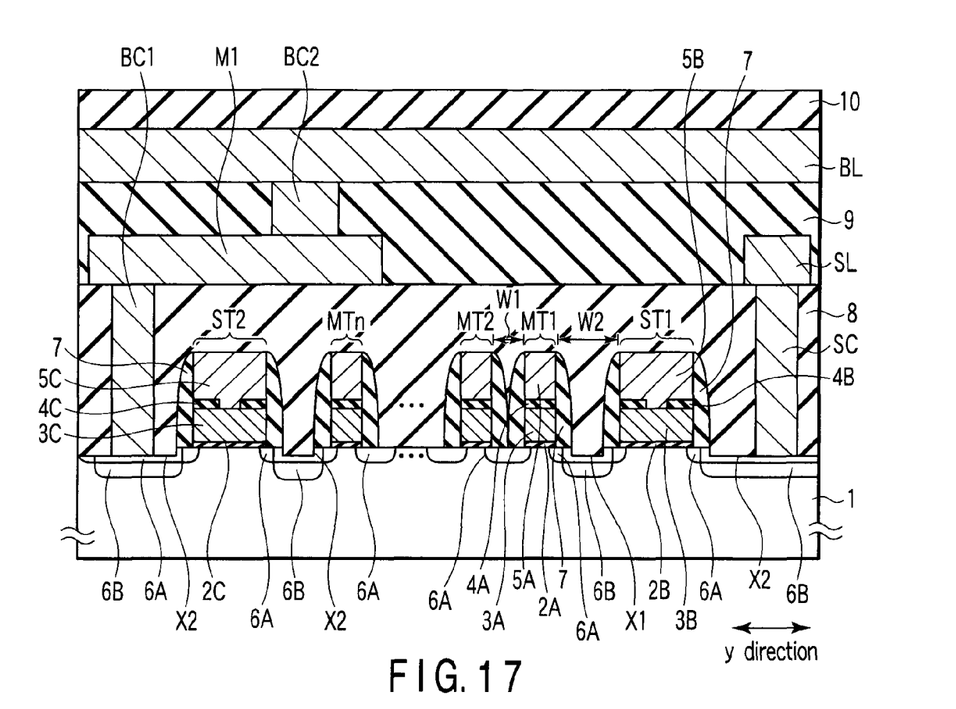

Reference is made to FIGS. 15, to 17 to describe the method of manufacture of the flash memory shown in FIG. 14.

First, the stacked gate electrodes of the memory cell transistors MT1 to MTn and the select gate transistors ST1 and ST2 are formed in accordance with the manufacturing steps of the first embodiment illustrated in FIGS. 3 to 6. After that, a spacer film is formed over the entire surface.

Next, the spacer film is etched back by the same process as shown in FIG. 7. After that, as shown in FIG. 15, the recesses X1 and X2 are formed into the diffusion layers 6A in a self-aligned manner by means of RIE using the spacer film 7 as a mask. Note that the recesses X1 and X2 may penetrate through the diffusion layers 6A into the semiconductor substrate 1.

Subsequently, the highly-doped diffusion layers 6B are formed by the same processes as shown in FIGS. 8 and 9 in the first embodiment and then the insulating layer 8 is formed. At this point, the recesses X1 and X2 are filled with the insulating layer 8.

The formation of the recesses X1 into the semiconductor substrate 1 results in an increase in the distance the memory cell current flows within the semiconductor substrate 1, which may cause or threaten a reduction in the memory cell current. However, the formation of the highly-doped diffusion layers 6B prevents the memory cell current from decreasing.

After that, the source and bit line contacts SC and BC1, the source line SL and the metal interconnection layer M1 are formed in sequence by the same processes as shown in FIG. 13. Then, the insulating layer 9, the second bit line contact BC2 and the bit line BL are formed in sequence. In addition, the insulating layer 10 is formed. Thus, the flash memory of this modification is finished as shown in FIG. 17.

As described above, the recess X1 is formed in the drain diffusion layers 6A and 6B of the select gate transistor ST1, thus allowing the distance the GIDL-based hot electrons move within the diffusion layers 6A and 6B to be made longer than the gate spacing W2.

Therefore, this increases the possibility that the hot electrons are scattered or trapped by impurities within the diffusion layers 6A and 6B.

It therefore becomes possible to reduce erroneous writing to memory cell transistors.

This modification can also be applied to the structures described in the first embodiment and the first modification to provide the same advantages.

(3) Third Modification

In the structures described so far, the impurity concentration of the diffusion layer shared by a select gate transistor and a memory cell transistor is set about two orders of magnitude higher than for the diffusion layer shared by two adjacent memory cell transistors.

For this reason, as the dimension of memory cell transistors are scaled down, a difference of threshold voltage indicating the write state will arise between a memory cell transistor having a highly-doped diffusion layer as its source/drain region and a memory cell transistor having a lightly-doped diffusion layer as its source/drain region. This lowers the reliability of flash memories.

Here, a description is given of a flash memory structured such that erroneous writing to memory cell transistors due to hot electrons is prevented and no difference of threshold voltage arises between memory cell transistors.

(a) Structure

Figure 18:
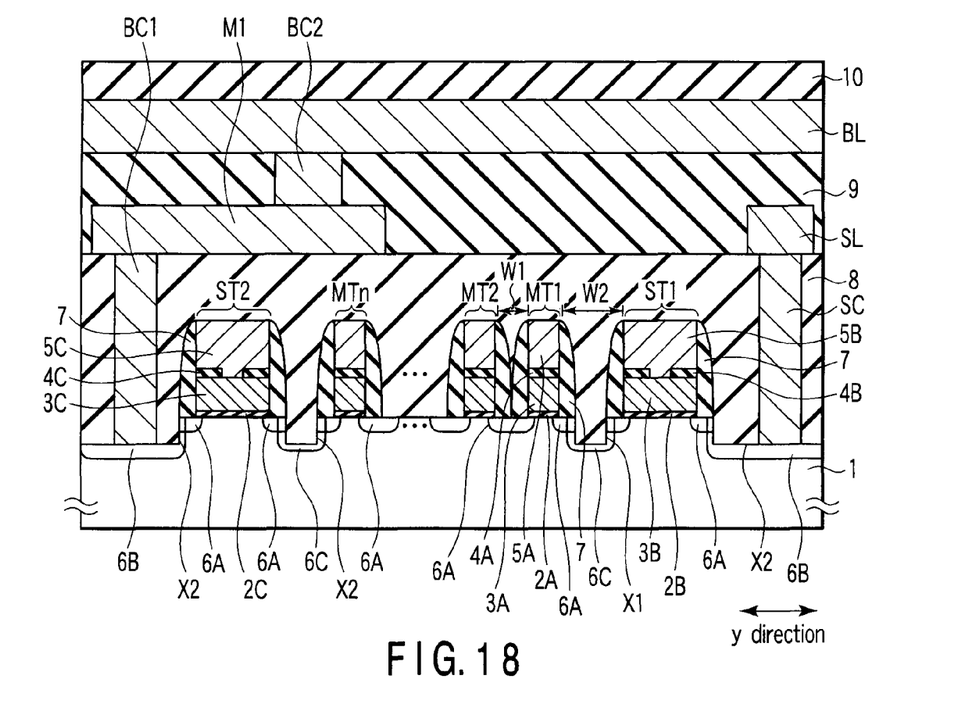
FIG. 18 is a sectional view of a flash memory according to a third modification.

The structure of a flash memory according to this modification will be described with reference to FIG. 18, in which like reference numbers are used to denote corresponding parts to those in FIG. 14, thereby simplifying the description.

This modification is characterized in that the impurity concentration of a diffusion layer 6C shared by the select gate transistor ST1 and the memory cell transistor MT1 differs from that of the diffusion layer 6B which is the source of the select gate transistor ST1 and is connected to the source line SL.

The impurity concentration of the diffusion layer 6C is set higher than that of the diffusion layer 6A shared by two adjacent memory cell transistors but lower than that of the diffusion layer 6B. The same holds true for the diffusion layer 6C shared by the select gate transistor ST2 and the memory cell transistor MTn.

This modification uses the structure of the second modification as its basic structure and has the recess X1 formed to penetrate through the diffusion layer 6A.

(b) Manufacturing Method

The method of manufacturing the flash memory shown in FIG. 18 will be described with reference to FIGS. 19 to 22.

Figure 19:
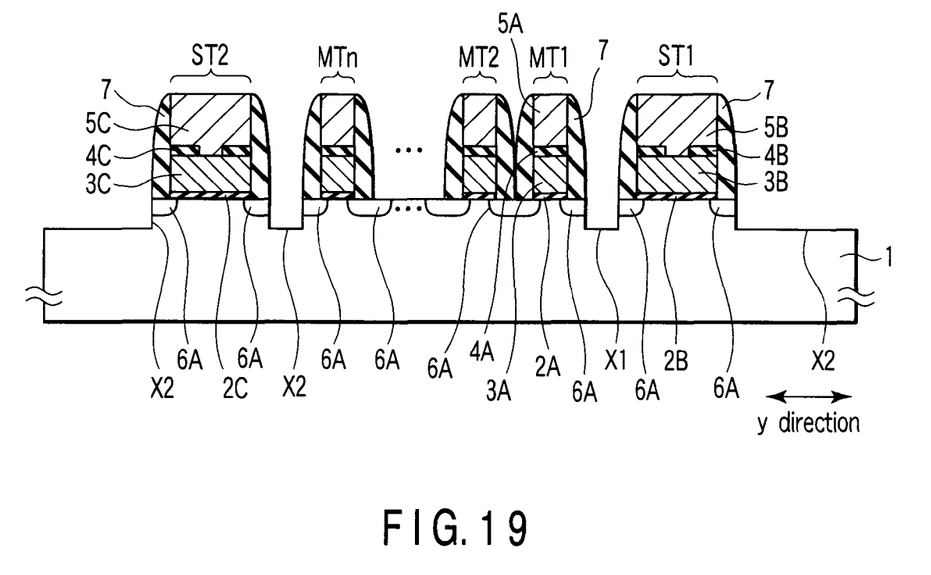
FIG. 19 is sectional views, in the order of steps of manufacture, of the flash memory of the third modification.

First, the structure shown in FIG. 19 is obtained by the same processes as described in the second modification. In this modification, the recesses X1 and X2 are formed to penetrate through the diffusion layers 6A into the semiconductor substrate 1.

Figure 20:
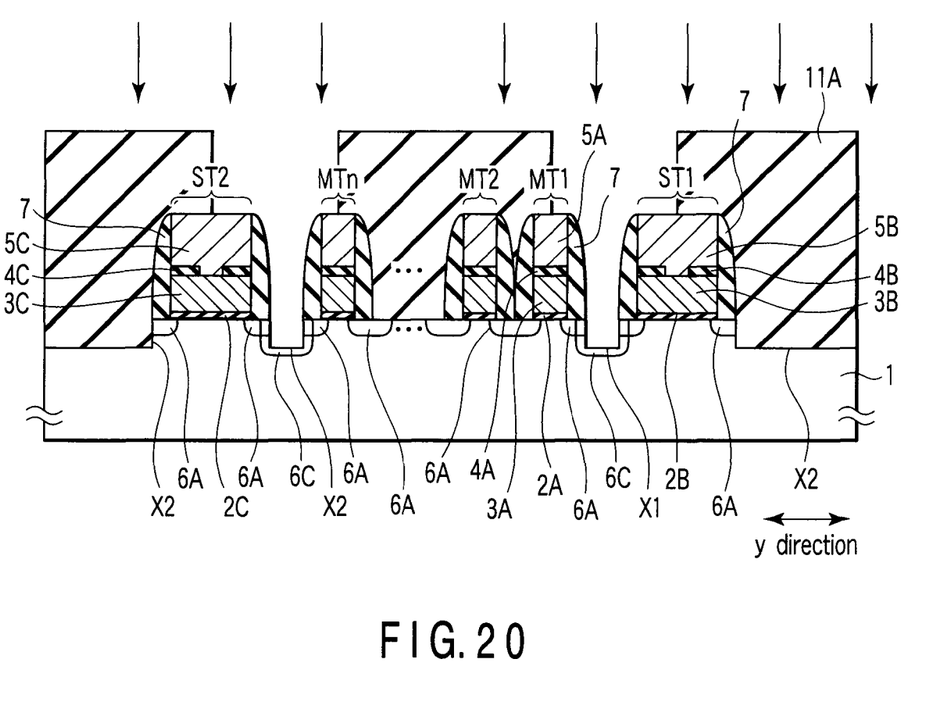
FIG. 20 is sectional views, in the order of steps of manufacture, of the flash memory of the third modification.

Next, as shown in FIG. 20, a resist pattern 11A is formed by means of photolithography. This resist pattern is formed to expose regions of the surface of the semiconductor substrate 1 which are located between gates the spacing of which is W2. Subsequently, the diffusion layers 6C are formed in the semiconductor substrate 1 by means of ion implantation using the resist pattern 11A as a mask.

Figure 21:
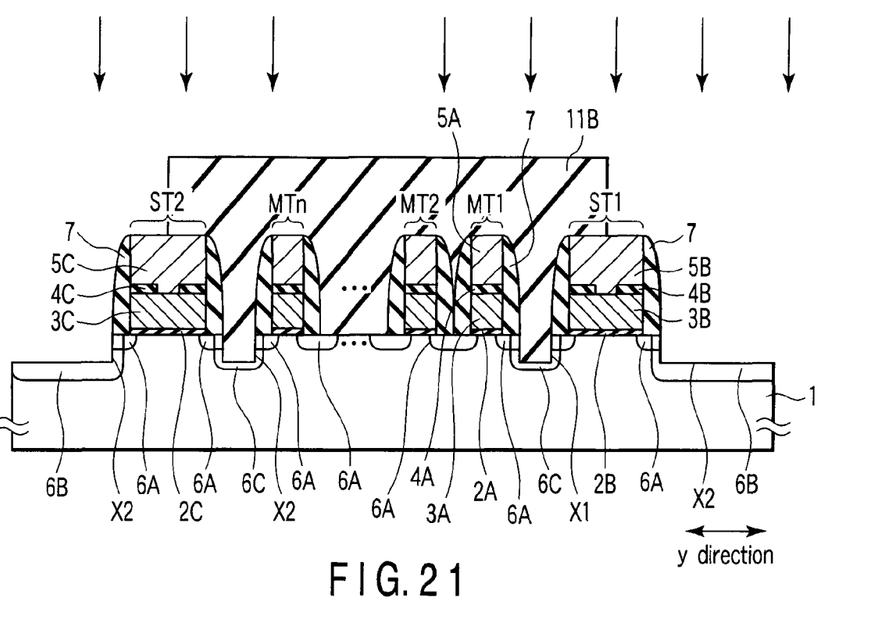
FIG. 21 is sectional views, in the order of steps of manufacture, of the flash memory of the third modification.

After the removal of the resist pattern 11A, a resist pattern 11B is formed by means of photolithography as shown in FIG. 21. This resist pattern is formed to expose regions of the surface of the semiconductor substrate 1 where the source line contact and the bit line contact are to be formed in subsequent steps. Then, the diffusion layers 6B are formed in the semiconductor substrate 1 by means of ion implantation using the resist pattern 11B as a mask.

The impurity concentration of the diffusion layers 6B is set to provide ohmic contact with the source line contact and the bit line contact which are to be formed in subsequent steps. For example, the impurity concentration of the diffusion layers 6B is set two orders of magnitude higher that of the diffusion layers 6A.

On the other hand, the impurity concentration of the diffusion layers 6C is set to such a level as to allow the possibility of scattering or trapping GIDL-based hot electrons to be increased. In addition, the impurity concentration of the diffusion layers 6C is set so as not to greatly affect the threshold voltage of memory cell transistors which use those diffusion layers as their respective source/drain regions. It is therefore desirable that the impurity concentration of the diffusion layers 6C be set higher than that of the diffusion layers 6A but lower than that of the diffusion layers 6B.

The order of the step of forming the diffusion layers 6C and the step of forming the diffusion layers 6B may be reversed.

Figure 22:
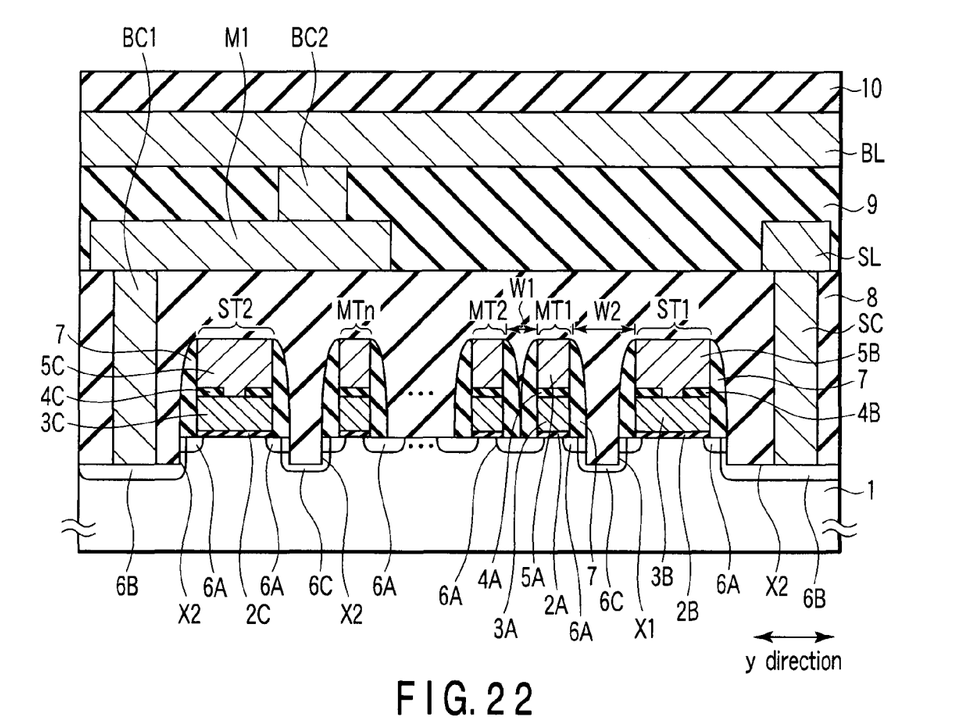
FIG. 22 is sectional views, in the order of steps of manufacture, of the flash memory of the third modification.

Next, the flash memory of this modification is finished as shown in FIG. 22 by using the same processes as shown in FIG. 17.

By the above processes, the possibility of GIDL-based hot electrons being injected into the floating gate electrode 3A of the memory cell transistor MT1 can be reduced without affecting the threshold voltage of the memory cell transistors MT1 and MTn.

It therefore becomes possible to reduce erroneous writing to the memory cell transistors.

This modification can also be applied to the structures described in the first embodiment and the first and second modifications to provide the same advantages.

(4) Fourth Modification

As previously mentioned, when a flash memory is written to, GIDL-based hot electrons are generated at the drain of the select gate transistor ST1.

Figure 23:
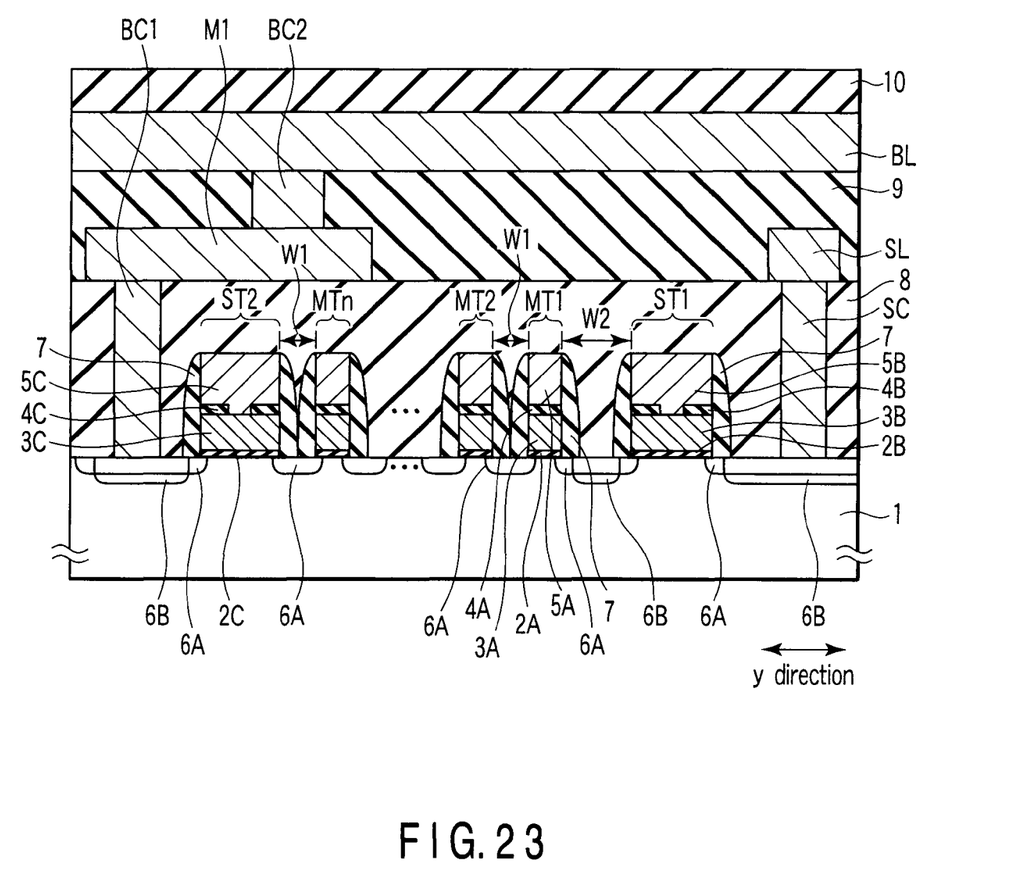
FIG. 23 is a sectional view of a flash memory according to a fourth modification.

On the other hand, as shown in FIG. 23, the select gate transistor ST2 which shares the source/drain diffusion layer 6A with the memory cell transistor MTn has its drain diffusion layers 6A and 6B connected to the bit line BL.

At write time, a voltage of, say, about 3 V is applied to the gate electrode 3C, 5C of the select gate transistor ST2 in order to self-boost memory cell transistors which need not be written to. Thus, the select gate transistor ST2 is not turned off at write time; therefore, no GIDL occurs in the select gate transistor ST2.

That is, there never occurs erroneous writing to the memory cell transistor MTn which results from GIDL in the select gate transistor ST2. Therefore, the gate spacing of the select gate transistor ST2 and the memory cell transistor MTn need not be increased and may be less than W2. For example, the gate spacing of the select gate transistor ST2 and the memory cell transistor MTn may be set equal to W1 as shown in FIG. 23, thus allowing the area of a chip in which a flash memory is formed to be reduced.

Even with the structure shown in FIG. 23, the gate spacing of the select gate transistor ST1 and the memory cell transistor MT1 is set to W2, larger than W1. The diffusion layers 6A and 6B shared by the memory cell transistor MT1 and the select gate transistor ST1 contain a highly-doped region (diffusion layer 6B).

Therefore, hot electrons resulting from the GIDL of the select gate transistor ST1 are scattered or trapped by impurities in the diffusion layers 6A and 6B and hence cannot be injected into the floating gate electrode 3A of the memory cell transistor MT1.

The structure of this modification shown in FIG. 23 in which the gate spacing of the select gate transistor ST2 and the memory cell transistor MTn is reduced may be applied to the first, second and third modifications. In this case as well, the same advantages as in this modification can be provided.

3. Others

The embodiments of the invention have been described by way of an example of using memory cell transistors of the stacked gate structure comprised of a floating gate electrode and a control gate electrode; however, this is not restrictive. As the memory cell transistors use may be made of transistors of metal-oxide-nitride-oxide-Semiconductor (MONOS) structure which uses an insulating film of, say, SiN as a charge storage layer instead of a floating gate electrode. The use of memory cell transistors of the MONOS structure will provide the same advantages as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a plurality of memory cell transistors which are connected in series to one another with a first gate spacing, every two adjacent transistors of the memory cell transistors sharing a source/drain diffusion layer; and
a first select gate transistor which shares a source/drain diffusion layer with an endmost memory cell transistor that is located at one end of the series connection of the memory cell transistors and is adjacent to that memory cell transistor with a second gate spacing,
wherein the second gate spacing is set larger than the first gate spacing and the source/drain diffusion layer shared by the endmost memory cell transistor and the first select gate transistor contains a region which is higher in impurity concentration than the source/drain diffusion layer shared by two adjacent memory cell transistors.

2. The nonvolatile semiconductor memory according to claim 1, wherein the second gate spacing of the first select gate transistor and the endmost memory cell transistor is set such that the space between their gate electrodes is not filled up by sidewall spacers formed on the gate electrodes.

3. The nonvolatile semiconductor memory according to claim 1, wherein the source/drain diffusion layer shared by the endmost memory cell transistor and the first select gate transistor has a recess.

4. The nonvolatile semiconductor memory according to claim 1, wherein the first select gate transistor has its source diffusion layer electrically connected to a source line, the source diffusion layer contains a region which is higher in impurity concentration than the source/drain diffusion layer shared by the endmost memory cell transistor and the first select gate transistor.

5. The nonvolatile semiconductor memory according to claim 1, further comprising a second select gate transistor which is adjacent to the other endmost memory cell transistor of the series-connected memory cell transistors and shares a source/drain diffusion layer with the other endmost transistor.

6. The nonvolatile semiconductor memory according to claim 5, wherein the source/drain diffusion layer shared by the other endmost memory cell transistor and the second select gate transistor has a recess.

7. The nonvolatile semiconductor memory according to claim 5, wherein the gate spacing of the second select gate transistor and the other endmost memory cell transistor is less than the second gate spacing.

8. The nonvolatile semiconductor memory according to claim 5, wherein the gate spacing of the second select gate transistor and the other endmost memory cell transistor is substantially equal to the second gate spacing.

9. The nonvolatile semiconductor memory according to claim 1, wherein the first gate spacing of the series-connected memory cell transistors is set such that the space between the gate electrodes of two adjacent memory cell transistors is filled up by sidewall spacers formed on the gate electrodes.

10. The nonvolatile semiconductor memory according to claim 5, wherein the source/drain diffusion layer shared by the other endmost memory cell transistor and the second select gate transistor is substantially equal in impurity concentration to the source/drain diffusion layers of the memory cell transistors.

11. The nonvolatile semiconductor memory according to claim 5, wherein the second select gate transistor has its drain diffusion layer electrically connected to a bit line, the drain diffusion layer contains a region which is higher in impurity concentration than the source/drain diffusion layer shared by the other endmost memory cell transistor and the second select gate transistor.

12. The nonvolatile semiconductor memory according to claim 1, wherein each of the memory cell transistors has a stacked gate structure which is composed of a floating gate electrode on a gate insulating film, an intergate insulating film on the floating gate electrode, and a control gate electrode on the intergate insulating film.

13. A nonvolatile semiconductor memory comprising:
a plurality of first memory cell transistors which are connected in series to one another with a first gate spacing between each memory cell transistor and the adjacent one and share a source/drain diffusion layer between every two adjacent memory cell transistors;
a second memory cell transistor which shares a source/drain diffusion layer with an endmost memory cell transistor of the series-connected memory cell transistors and is adjacent to the endmost memory cell transistor with a second gate spacing therebetween; and
a first select gate transistor which shares a source/drain diffusion layer with the second memory cell transistor and is adjacent to the second memory cell transistor with a third gate spacing therebetween, wherein the first gate spacing is larger than the second gate spacing but smaller than the third gate spacing, and the source/drain diffusion layer shared by the second memory cell transistor and the first select gate transistor contains a region which is higher in impurity concentration than the source/drain diffusion layer shared by the memory cell transistors.

14. The nonvolatile semiconductor memory according to claim 13, wherein the third gate spacing is set such that the space between the gate electrodes of the first select gate transistor and the endmost memory cell transistor is not filled up by sidewall spacers formed on the gate electrodes.

15. The nonvolatile semiconductor memory according to claim 13, wherein the source/drain diffusion layer shared by the second memory cell transistor and the first select gate transistor has a recess.

16. The nonvolatile semiconductor memory according to claim 13, further comprising a third memory cell transistor which shares a source/drain diffusion layer with the other endmost transistor of the series-connected memory cell transistors with which the second memory cell transistor is connected in series and a second select gate transistor which is adjacent to the third memory cell transistor.

* * * * *